United States Patent [19]

Futagawa et al.

[11] 4,075,623
[45] Feb. 21, 1978

[54] REFERENCE VOLTAGE CIRCUIT

[75] Inventors: Yoshikiyo Futagawa; Kanemitsu Kubota; Hiroshi Kamakura, all of Shiojiri, Japan

[73] Assignees: Kabushiki Kaisha Suwa Seikosha, Tokyo; Shinshu Seiki Kabushiki Kaisha, both of Japan

[21] Appl. No.: 700,264

[22] Filed: June 28, 1976

[30] Foreign Application Priority Data

June 26, 1975 Japan .................................. 50-79770

[51] Int. Cl.² ...................... H03K 13/02; G05F 3/14
[52] U.S. Cl. ............................ 340/347 NT; 307/297; 320/1; 323/22 R
[58] Field of Search ................ 340/347 NT, 173 CA; 323/22 R, 22 Z; 324/99 D; 307/297, 318, 304, 246, 251, 296; 320/1

[56] References Cited

U.S. PATENT DOCUMENTS

| 3,193,803 | 7/1965 | Hoffman | 320/1 |
| 3,201,616 | 8/1965 | Houpt | 320/1 |
| 3,746,892 | 7/1973 | Ogiso et al. | 307/297 |
| 3,839,673 | 10/1974 | Acker | 320/1 |
| 3,913,006 | 10/1975 | Fillmore | 320/1 |
| 3,967,270 | 6/1976 | Anderson et al. | 340/347 NT |
| 3,999,123 | 12/1976 | Thoener | 340/347 NT |

OTHER PUBLICATIONS

Pohl: Zener in Preregulator Limits Series, p. 98, Transistor Dissipation; Electronics, vol. 42, No. 2, Oct. 27, 1969.

Primary Examiner—Felix D. Gruber
Attorney, Agent, or Firm—Blum, Moscovitz, Friedman & Kaplan

[57] ABSTRACT

An improved circuit for providing a fixed reference voltage with a minimum consumption of power is provided. The circuit includes a fixed voltage element adapted to be referenced to a fixed voltage. A charge storage element is coupled in series with a uni-directional current gating element, the series coupled charge storage element and uni-directional current gating element being coupled in parallel with the fixed voltage element. A voltage supply intermittently applies a referencing voltage across the fixed voltage element to thereby intermittently charge the charge storage element to a fixed reference voltage for at least a predetermined period of time.

21 Claims, 9 Drawing Figures

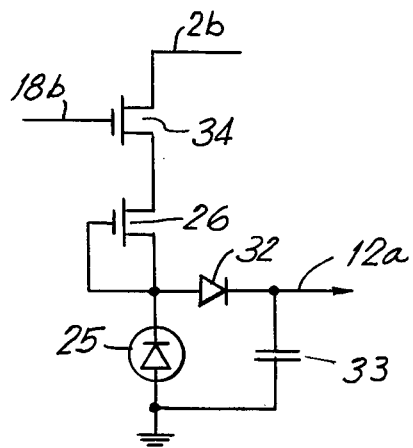
FIG.6
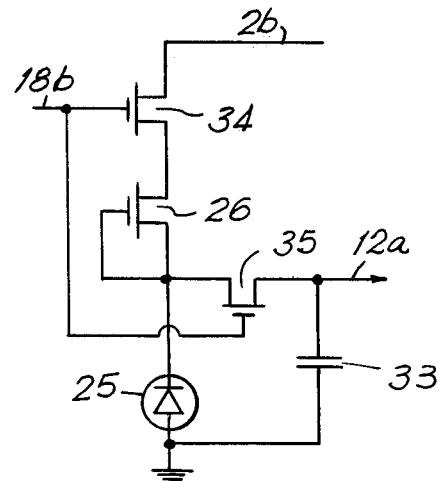
FIG.7
FIG.8
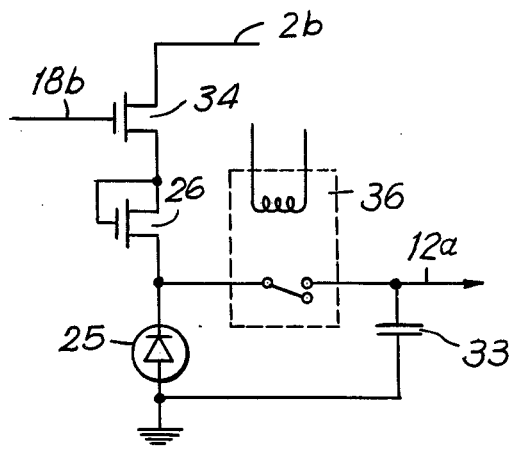

REFERENCE VOLTAGE CIRCUIT

BACKGROUND OF THE INVENTION

This invention is directed to an improved circuit for providing the fixed reference voltage with a minimum of power consumption, and in particular, to a circuit for providing a fixed reference voltage particularly suited for use in smallsized battery operated electronic instrumentation such as an analog-to-digital voltage tester.

Small sized battery operated electronic instruments, such as digital voltage testers utilize a Zener diode as a fixed reference voltage element. Although Zener diodes are particularly suited for use in miniaturized circuits requiring a fixed reference voltage, if the Zener diode continues to be energized, the power consumption thereof is considerable. It is noted that the greater the power consumption of the circuit elements in portable miniaturized electronic instruments, the faster the life of the batteries utilized to energize same will be exhausted. Moreover, when electronic instruments such as digital display voltage testers utilize LED (light-emitting diodes), fluorescent display tubes, etc. as the display elements, the power consumption is further increased. Although the use of liquid crystal display elements can considerably reduce the power consumption of the digital display, it is desired to substantially reduce the power consumption of the Zener diode, when same is utilized as a fixed reference voltage element.

SUMMARY OF THE INVENTION

Generally speaking, in accordance with the instant invention, a circuit for providing a fixed reference voltage with a minimum of power consumption is provided. The circuit includes a fixed voltage element adapted to be referenced to a fixed voltage in response to a referencing voltage being applied thereto. A charge storage element is adapted to be charged to a reference voltage and is coupled in series with a unidirectional current gating element. The series coupled uni-directional current gating element and the charge storage element are coupled in parallel with the fixed voltage element. A voltage supply is adapted to intermittently apply a referencing voltage across said fixed voltage element to thereby intermittently charge the charge storage element to a fixed reference voltage for at least a predetermined period of time.

Accordingly, it is an object of this invention to reduce the power consumption of a fixed reference voltage circuit.

A further object of this invention is to reduce the power consumption of a fixed reference voltage circuit utilized in analog-to-digital converting circuitry.

Still a further object of the instant invention is to extend the life of a DC cell in a portable digital voltage tester.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. 6, 7 and 8 are detailed circuit diagrams of alternate emobidments of fixed reference voltage circuits constructed in accordance with the instant invention.

DETAILED DESCRIPTION OF THE PREFERRED EMBODIMENTS

Figure 1:
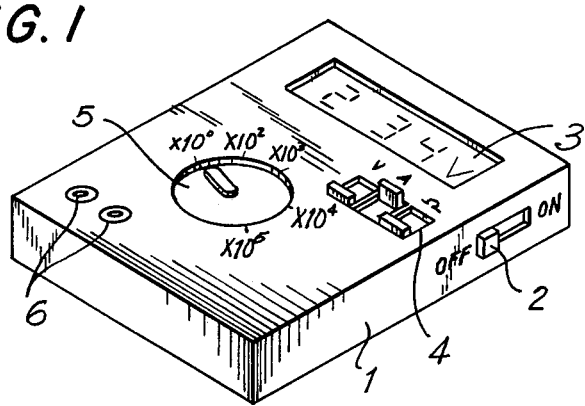
FIG. 1 is a perspective view of a digital voltage tester including a fixed reference voltage circuit constructed in accordance with the preferred embodiments of the instant invention.

Reference is now made to FIG. 1, wherein a miniaturized, portable digital display voltage, resistance and current tester is depicted. The tester includes a case 1 supporting a liquid crystal digital display 3, the liquid crystal display elements reducing the power consumption of the display. Switch 2 is coupled to a power source for turning the power source on or off in order to energize the digital display tester. A series of change over switches 4 are utilized to dispose the tester to measure voltages, currents or resistances. A manually operated range changing switch 5 is provided for changing over the ranges that the tester is effective in testing. It is noted that digital voltage testers having automatic range-changing circuits are also well known. Connecting terminals 6 are provided for receiving probes in order to measure the voltage, resistance or current of the respective circuit element tested.

Figure 2:
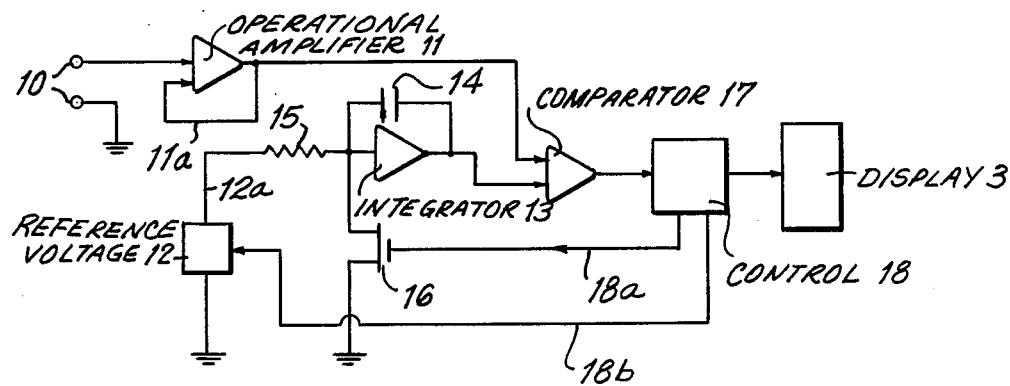
FIG. 2 is a block circuit diagram of the analog-to-digital converter circuit of the digital voltage tester depicted in FIG. 1.

Reference is now made to FIG. 2, wherein an analog-to-digital converter circuit of the type utilized in the digital display tester depicted in FIG. 1 is illustrated. Input terminals 10 for receiving the voltage to be tested are coupled to an operational amplifier 11, which operational amplifier is provided with a unitary amplification-coefficient by feeding the output thereof back through feedback loop 11a. The operational amplifier 11 does not affect the voltage of the element to be tested since the input impedance thereof is 40kΩ or greater. As is detailed with greater specificity below, the output of the operational amplifier 11 is applied to a comparator circuit 17.

A reference voltage circuit 12 has an output 12a coupled through a resistor 15 to the input of an integrator circuit 13, which integrator circuit 13 includes a capacitor 14 coupled in parallel therewith. The capacitor 14, resistor 15 and integrator circuit 13 cooperate to accurately integrate the reference voltage 12 in a linearly increasing fashion. A switching transistor 16 is coupled to the input of the integrator 13 to control the reset time thereof. Comparator 17 detects the linearly increasing voltage level of the integrator 13 and the voltage level applied at the input terminals 10 and in response to detecting a coincidence therebetween applies an output pulse to control circuit 18. Control circuit 18 includes a time standard (not shown) and a counter means (not shown) for counting the period of time over which the integrator 13 integrates the reference voltage 12 until the comparator circuit 17 detects coincidence between the voltage level integrated by the integrator circuit 13 and the voltage applied to the input terminals, and thereafter applies the digital count to the digital display 3 of the tester. The control circuit 18 produces a reset signal 18a, which signal is applied to MOS transistor 16 to reset the integrator at the beginning of each testing operation in order to insure that the integrator starts integrating from a zero level at the same time that the count of the counter in the control circuit is zero. A switching signal 18b is applied to the reference voltage circuit 12 in the instant invention, in order to effect intermittent switching thereof. As will be explained in greater detail below, prior art reference voltage circuits of the type depicted in FIG. 4 do not utilize intermittent switching and hence are absent the requirements of a switching signal 18b produced by the control circuit 18.

Figure 2A:
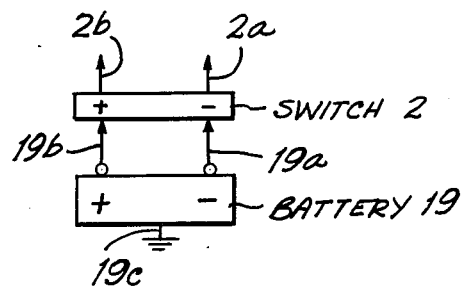
FIG. 2a is a block circuit diagram of the battery circuit for the analog-to-digital converter circuit depicted in FIG. 2.

Reference is now made to FIG. 2a, wherein the battery supply circuit for the analog-digital converter circuit depicted in FIG. 2 is illustrated. A battery 19 having positive and negative poles 19a and 19b respectively, and an intermediate reference potential 19c are coupled through terminals 2a and 2b respectively of the switch 2 of the digital tester to thereby energize the respective circuit elements of the digital tester.

Figure 3:
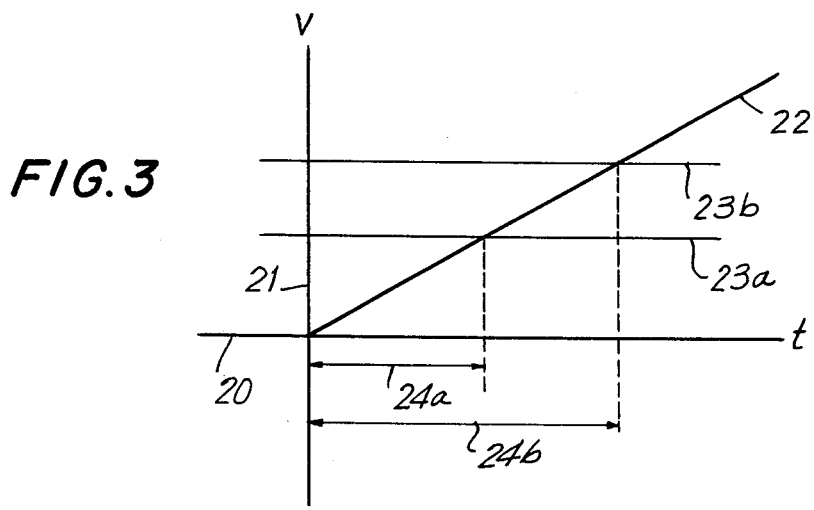
FIG. 3 is a graphical illustration of the operation of the analog-to-digital converter circuit depcited in FIG. 2.

Referring specifically to FIG. 3, operation of the analog-to-digital conversion circuitry depicted in FIG. 2 is best understood. The ordinate 21 in FIG. 2 illustrates the input voltage and the abscissa 20 represents the time over which the input voltage is compared with the time over which the reference voltage is integrated. The incline 22 illustrates the linearly increasing voltage level of the integrator circuit 13 when same integrates the fixed reference voltage applied to the input thereof. Levels 23a and 23b represent different input voltages measured by the digital tester circuit.

In operation, when for example, the voltage level 23a is to be measured by the digital tester, the switch 2 is turned on, thereby energizing all of the circuits of the digital tester depicted in FIG. 2. The control circuit 18 applies a reset signal 18a to MOS transistor 15, to thereby reset the voltage level of integrator circuit 13 to zero. Thereafter, the input voltage level 23a is applied to the input terminals 10 and the integrator circuit 13 begins integrating the fixed reference voltage produced by the reference voltage element 12. The linearly increasing voltage level of the integrator circuit is detected by the comparator 17, and when the voltage level thereof coincides with the voltage level applied at the input terminals 10, the comparator 17 applies a signal to the control circuit 18 to stop the counter thereof from counting. Accordingly, the control circuit 18 commences counting upon the resetting of the integrator circuit to zero and stops counting when a coincidence level is detected by the comparator 17. For the voltage level 23a depicted in FIG. 3, a time period illustrated as 24a elapses, which period is represented by the digital count of the counter in the control circuit 18, and this digital representation is displayed by digital display 3. If a higher voltage level 23b is applied to the input terminals, the period of time required for the comparator 17 to detect coincidence between the voltage level of the integrator circuit 13 and the voltage level applied to the input terminals 10 is greater, as represented by 24b in FIG. 3, and thereby permits the counter in the control circuit 18 to count longer and hence provide a relatively higher value, which value is applied to the digital display 3 as a digital representation of the voltage applied at the input terminals 10. Accordingly, the input voltage is accurately calculated and digitally displayed in accordance with the respective period of elapsed time between commencement of the operation of the integrator circuit 13 and coincidence between the voltage level thereof and the input voltage. It is noted that when the change over switches 4 are actuated to change the tester depicted in FIG. 1 into a tester for measuring current, a resistance type voltage divider circuit is utilized. Specifically, a fixed small resistor is disposed between the input terminals 10 to thereby effect a measurement of current. Furthermore, when resistance is measured, the resistance is transformed into a voltage by disposing a reference voltage and reference resistance in the input portion of the input terminal 10, thereby permitting the resistance to be measured.

Figure 4:
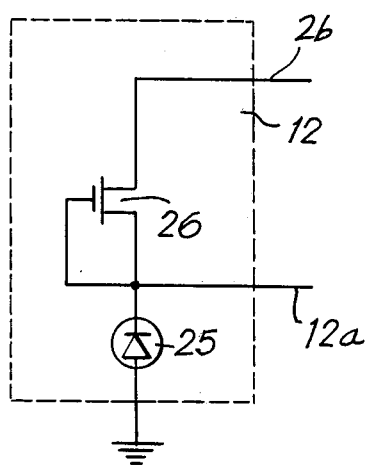
FIG. 4 is a detailed circuit diagram of an analog-to-digital converter circuit reference voltage circuit constructed in accordance with the prior art.
Figure 5:
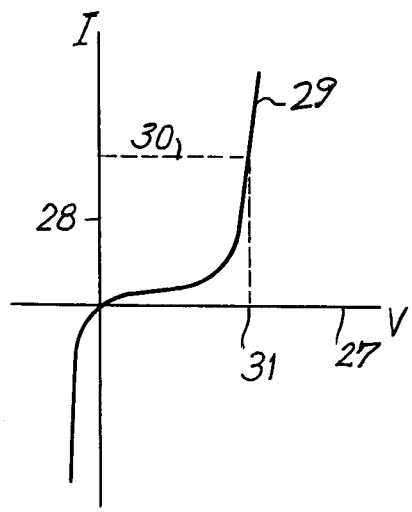
FIG. 5 is a graphical illustration of the operation of the Zener diode depicted in FIG. 4.

Reference is now made to FIG. 4, wherein a fixed reference voltage circuit constructed in accordance with the prior art and representative of the type of fixed reference voltage circuits utilized in prior art analog-to-digital converter circuits of the type depicted in FIG. 2, is illustrated. The fixed reference voltage circuit 12 includes a Zener diode 25 and a field-effect transistor 26, with the junction therebetween being coupled to the input 12a of the integrator circuit. The field-effect transistor 26 is utilized to balance the voltage and current characteristics between the source and drain electrodes to thereby regulate and apply a constant current to the Zener diode during operation. The voltage-current characteristic of the Zener diode 25 is illustrated in FIG. 5, wherein the abscissa 27 represents the voltage, and the ordinate 28 represents current. The characteristic curve 29 demonstrates that an accurate and fixed reference voltage level 31 is obtained when a sufficient current level 30 is provided, thereby guaranteeing a fixed reference voltage level being applied to the input 12a of the integrator circuit. Moreover, the temperature characteristic of the Zener diode is good when a current on the order of 6 mA and a Zener voltage on the order of 6V, which voltage is applied as a reference voltage, is produced.

Nevertheless, when a fixed reference voltage circuit of the type depicted in FIG. 4 is utilized, considerable power consumption results. If Zener diode 25 has 6V applied thereto, and field-effect transistor 26 requires 6V to operate as a constant current source, a battery 19, on the order of 12V is selected. Accordingly, power consumption of the reference voltage circuit 12 when the above noted parameters obtain is $$12V \times 6mA = 72mW$$

which represents a considerably large current consumption. It is noted that the power consumption of the remaining components of the analog-to-digital conversion circuit is negligible when compared with the 72mW value of the reference voltage circuit. For example, the operational amplifier 11, integrator circuit 13, comparator circuit 17 have a power consumption factor of 1mW or less when a 12V voltage supply is utilized. Moreover, power consumption of the control circuit 18 can also be limited to 1mW or less by utilizing C-MOS transistor circuitry. Finally, by utilizing liquid crystal in the display device, the power consumption can be limited to 100mW or less, and for purposes of this discussion, the power consumption of the liquid crystals, which power consumption is fixed thereby, is not taken into account.

Accordingly, the power consumption of all of the remaining elements, with the exception of the reference voltage circuit 12 and digital display does not exceed 4mW, which is considerably less than the 72mW of the reference voltage circuit 12. The instant invention is particularly characterized by a reduction of the power consumption of the fixed reference voltage circuit to less than several mW. For example, when a conventional reference voltage circuit of the type depicted in FIG. 4 is utilized, the power consumption of the digital tester circuitry in FIG. 2 is 72 + 1 + 1 + 1 + 1 = 76mW. In contradistinction thereto, the reference voltage circuit of the instant invention can provide power consumption of 1mW or less and thereby result in the power consumption of the tester circuitry not exceeding 1 + 1 + 1 + 1 + 1 = 5mW. Thus, when compared with conventional reference voltage circuits, the instant invention provides a reference voltage circuit that reduces power consumption by 1/15 (76 ÷ 5). When translated into measuring battery life, if a digital tester utilizes a DC voltage supply of 12 volts, such as for example, by utilizing eight 1.5 volt cells of the type utilized in a electronic wristwatch, the capacity of each cell is 150mAHrs. Accordingly, the battery life is then equal to 12V × 150mAHrs. ÷ 5mW = 360 Hours Assuming that such a digital tester is used one hour a day, the battery life is thereby extended to one year thus making a miniaturized and portable digital tester of the type depicted in FIG. 1 more practical.

Reference is now made to FIG. 6, wherein a fixed reference voltage circuit constructed in accordance with the instant invention and capable of providing power consumption of several mW or less is depicted, like reference numerals being utilized to denote like elements depicted above. In addition to the field-effect transistor 26 and Zener diode 25, a field-effect switching transistor 34 is coupled in series with field-effect transistor 26 for dividing a fixed resistive element to effectuate the delivery of a substantially constant current. The gate electrode 18b, as illustrated in FIG. 6 is coupled to a control circuit in order to effect intermittent switching thereof in a manner to be discussed more fully below. The current path defined by the source-drain electrodes is coupled to the battery terminal 2b in order to selectively reference the reference voltage circuit to the supply voltage. A diode 32 is coupled to the cathode of the Zener diode 25 and is coupled in series with a capacitor 33. Capacitor 33 and diode 32 are coupled in parallel with Zener diode 25 and the junction between the cathode of diode 32 and capacitor 33 defines the input to the integrator circuit for applying a fixed reference voltage thereto. As was noted above, the instant invention is characterized by the use of switching transistor 34, which transistor is absent in the reference voltage circuit depicted in FIG. 6, and would be absent from prior art analog-to-digital converters operating in the same manner as the circuit depicted in FIG. 2. Operation of the fixed reference voltage circuit depicted in FIG. 6 is as follows. When switching transistor 34 is turned ON, a DC voltage is applied across the Zener diode 25 and the capacitor 33 is charged to a voltage having a value equal to the fixed voltage of the Zener diode 25, less the voltage drop across the diode 32 caused by the forward biasing of same. Since the charging current ceases to be applied to the capacitor 33, once the capacitor is fully charged, and furthermore, since the capacitor 33 is almost instantaneously charged, the power consumption of the fixed reference voltage circuit is rendered negligible in a short time. Moreover, once the capacitor 33 is fully charged, the Zener diode shuts down, thereby further minimizing current consumption. Hence, the voltage of the capacitor 33 is substituted for the voltage of the Zener diode 25 and is applied to the input of the integrator circuitry. Thus, by recognizing that the power consumption of the Zener diode is going to be the same as a conventional diode when a conventional diode is being forwardly biased, the switching transistor 34 effects intermittent energization of the capacitor 33 to thereby substantially reduce current consumption.

Accordingly, if the duty cycle selected by the switching transistor 34 is, for example, one seventy-second of a second, the power consumption of the reference voltage circuit illustrated in FIG. 6 becomes one seventy-second of the aforementioned 72mW value, or one mW. It is noted that intermittent energization of the circuit is made possible because the capacitor acts as a charge storage device and remains charged to the fixed reference voltage level for a predetermined period of time determined by the size of the capacitor.

It is also noted that the voltage drop characteristic of the diode 32 is less than completely satisfactory due to the impedance of the p-n junction forming same being dependent on temperature. Accordingly, in order to further increase the accuracy of a fixed reference voltage circuit constructed in accordance with the instant invention, the diode 32 can be replaced by either a further switching transistor or alternatively, a relay.

Reference is now made to FIG. 7, wherein a reference voltage circuit, in accordance with the instant invention, wherein the diode 32 is replaced by a switching transistor 35, is depicted. The gate electrode of the switching transistor 35 is coupled to the gate terminal of the switching transistor 34, and, accordingly, is intermittently switched by switching signal 18b at the same interval as the switching transistor 34. It is noted that the switching transistor 35 can also be switched at shorter intervals than the transistor 34 due to the instantaneous charging characteristic of the capacitor 33. However, it is imperative that the intermittent switching intervals of the transistor 35 not be longer than the switching of the transistor 34 since such an occurrence would permit the capacitor 33 to be discharged through the switching transistor 35 and the Zener diode 25. Accordingly, the transistor 35, like the diode 32, effects uni-directional gating of the current of the capacitor 33. Moreover, by utilizing and MOS field-effect transistor 34 as a unidirectional current gating element, the voltage drop thereacross is 1mV or less, and is particularly effective in providing an accurate reference voltage in accordance with the instant invention. Moreover, the accuracy will be considerably greater than if a diode is used due to the smaller voltage drop across the transistor caused by the forward impedence junction when same is conductive.

Referring now to FIG. 8, a reference voltage circuit, in accordance with the instant invention, wherein unidirectional current gating is effected by utilizing a relay 36, is depicted, like reference numerals being utilized in like elements being depicted above. The relay can be coupled to the gate electrode of the switching transistor 34 and thereby controlled by switching signal 18b, or alternatively can be coupled to the control circuit of the analog-to-digital circuit to be controlled thereby. It is noted that when relay 36 is utilized, the most efficient charging of the capacitor 33 is obtained, since the voltage drop in the relay is zero. In such an arrangement, the capacitor 33 is charged to the same reference voltage as the Zener diode 25. Nevertheless, the power consumption required to effect switching of the relay is considerable, thereby rendering it necessary to further reduce the duty cycle of the switching transistor 34 in order to compensate for the increased power required to operate the relay 36.

Accordingly, the reference voltage circuits of the instant invention are particularly characterized by a reduction in power consumption obtained by reducing the duty cycles and rapidly charging the capacitor in each of the circuits depicted in FIGS. 6, 7 and 8. Nevertheless, because the capacitor 33 is intermittently charged, if the duty cycle is sufficiently reduced, it will increase the time required for the voltage level of the capacitor 33 to reach a final reference voltage level, which can be as long as several minutes. Thus, charging of the capacitor and reduction of the duty cycle must be balanced to provide an accurate reference voltage circuit wherein a minimum of power is consumed. Such a reference voltage circuit is particularly suited to be utilized in small sized electronic instrumention, tools and the like.

It will thus be seen that the object set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A circuit for producing a reference voltage, comprising in combination, a fixed voltage means adapted to be referenced to a fixed voltage in response to a referencing voltage being applied thereto, a charge storage means adapted to be charged to a reference voltage, a current gating means coupled in series with said charge storage means, said series coupled current gating means and said charge storage means being coupled in parallel with said fixed voltage means, and supply means for supplying a referencing voltage, a first switching means disposed intermediate said supply means and said fixed voltage means for intermittently applying said referencing voltage to said charge storage means and said fixed voltage means to thereby intermittently charge said charge storage means to a fixed reference voltage for at least a predetermined period of time.

2. A reference voltage circuit as claimed in claim 1, wherein said fixed voltage means is a Zener diode means.

3. A reference voltage circuit as claimed in claim 2, and including transistor means disposed intermediate said first switching means and said Zener diode means, said transistor means including a control electrode being coupled to said Zener diode means to thereby regularize the current applied thereto when said referencing voltage is selectively applied thereacross.

4. A reference voltage circuit as claimed in claim 1, wherein said charge storage means includes capacitor means, said capacitor means being charged to a voltage equal to the fixed voltage of said fixed voltage means less the voltage drop across said uni-directional current gating means when said referencing voltage is selectively applied across said fixed voltage means.

5. A reference voltage circuit as claimed in claim 4, wherein said current gating means is a diode means for providing uni-directional current gating.

6. A reference voltage circuit as claimed in claim 4, wherein said current gating means includes second switching means for defining a closed current path to said capacitor means for at least a portion of said interval that said first switching means selectively applies said referencing voltage across said charge storage means and fixed voltage means, and further defines an open circuit between said supply means and said capacitor means when said first switching means is not applying said referencing voltage across said capacitor means and fixed voltage means.

7. A reference voltage circuit as claimed in claim 6, wherein said second switching means is a relay.

8. A reference voltage circuit as claimed in claim 6, wherein said second switching means is a transistor means including a control electrode coupled to said first switching means to be controlled in accordance with the operation thereof.

9. A reference voltage circuit as claimed in claim 4, wherein said fixed voltage means is a Zener diode, said current gating means is a diode, said first switching means is a field-effect transistor, and including a second field-effect transistor coupled in series with said parallel coupled Zener diode and diode and capacitor, said second field-effect transistor being further coupled in series with said first field-effect transistor, said second field-effect transistor including a gate electrode coupled to said Zener diode in order to regularize the current applied thereto.

10. A reference voltage circuit as claimed in claim 4, wherein said fixed voltage means is a Zener diode, said first switching means is a first field-effect transistor, said current gating means is a third field-effect transistor, and including a second field-effect transistor series coupled intermediate said first field-effect transistor and said parallel coupled Zener diode and third field-effect transistor and capacitor means, said third field-effect transistor means including a gate electrode coupled to the gate electrode of said first field-effect transistor, the gate electrode of said second field-effect transistor being coupled to said Zener diode to regularize the current applied thereto.

11. A reference voltage circuit as claimed in claim 4, wherein said fixed voltage means is a Zener diode, said current gating means is a relay, said first switching means is a field-effect transistor, and including a second field-effect transistor series coupled intermediate said first field-effect transistor and said parallel coupled Zener diode and relay and capacitor means, said second field-effect transistor including a gate electrode coupled to said Zener diode in order to regularize the current applied thereto.

12. In an analog-to-digital converter circuit including reference voltage circuit means for producing a fixed reference voltage, integrator circuit means for integrating said fixed reference voltage, comparator means for comparing the voltage level of said integrated fixed reference voltage with a further voltage level, and control means coupled to the comparator means for producing a digital count representative of the magnitude of said further voltage level, the improvement comprising said fixed reference voltage circuit including a fixed voltage means adapted to be referenced to a fixed voltage in response to a referencing voltage being applied thereto, charge storage means coupled to said integrator circuit means and adapted to be charged to a reference voltage, a current gating means coupled in series with said charge storage means, said series-coupled current gating means and said charge storage means being coupled in parallel with said fixed voltage means, and supply means coupled to said control means for supplying a referencing voltage, a first transistor switching means disposed intermediate said supply means and said fixed voltage means for intermittently applying said referencing voltage to said charge storage means and said fixed voltage means for a sufficient interval of time to charge said storage means to a reference voltage when said fixed reference voltage is to be integrated by said integrator means.

13. An analog-to-digital converter circuit as claimed in claim 12, wherein said charge storage means includes capacitor means, said capacitor means being charged to a voltage equal to said fixed voltage of said fixed voltage means less the voltage drop across said uni-directional current gating means when said referencing voltage is selectively applied to said fixed voltage means.

14. An analog-to-digital converter circuit as claimed in claim 13, wherein said current gating means is a diode means for providing a uni-directional gating of current.

15. An analog-to-digital converter circuit as claimed in claim 13, wherein said current gating means includes second switching means coupled to said supply switching means for defining a closed current path to said capacitor means for at least a portion of said interval that said first switching means selectively applies said reference voltage across said capacitor means and said fixed voltage means, and defines an open circuit between said supply means and said capacitor means when said first switching means prevents said reference voltage produced by said supply means from being applied across said capacitor means and said fixed voltage means.

16. An analog-to-digital converter circuit as claimed in claim 15, wherein said second switching means is a relay.

17. An analog-to-digital converter circuit as claimed in claim 15, wherein said second switching means is a field-effect transistor means having said control electrode coupled to said first switching means to be controlled thereby.

18. An analog-to-digital converter circuit as claimed in claim 12, wherein said fixed voltage means is a Zener diode, said charge storage means is a capacitor means, and said first switching means is a field-effect transistor wherein the gate electrode of said field-effect transistor is coupled to said control means, and second field-effect transistor means coupled intermediate said first field-effect switching transistor and said parallel coupled Zener diode and current gating means and capacitor means, the gate electrode of said second field-effect transistor means being coupled to said Zener diode, to thereby regularize the current applied thereto when said first field-effect switching transistor applies said reference voltage across said reference voltage means and said capacitor means.

19. An analog-to-digital converter circuit as claimed in claim 18, wherein said current gating means is a diode.

20. An analog-to-digital converter circuit as claimed in claim 18, wherein said current gating means is a relay.

21. An analog-to-digital converter circuit as claimed in claim 18, wherein said current gating means is a third field-effect transistor, the control electrode of said third field-effect transistor being coupled to the control electrode of said first field-effect switching transistor to thereby be controlled by said control means.

* * * * *